(12) United States Patent
Gerber (10) Patent No.: US 7,078,808 B2
(45) Date of Patent: Jul. 18, 2006

(54) DOUBLE DENSITY METHOD FOR WIREBOND INTERCONNECT

(75) Inventor: Mark Allen Gerber, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/850,495

(22) Filed: May 20, 2004

(65) Prior Publication Data

US 2005/0258538 A1    Nov. 24, 2005

(51) Int. Cl.
*H01L 23/52* (2006.01)
*H01L 23/48* (2006.01)
*H01L 29/40* (2006.01)

(52) U.S. Cl. ............... 257/738; 257/690; 257/782; 257/784

(58) Field of Classification Search ........ 257/782–784, 257/777–784, 690–700
See application file for complete search history.

(56) References Cited

U.S. PATENT DOCUMENTS 6,605,871 B1 * 8/2003 Chaki ................... 257/691

OTHER PUBLICATIONS

"Fine Pitch Ball Bonding," Gaiser Tool Company, http://www.gaisertool.com/bonding/products/capillaries/info/fineptich.html, 1999, 3 p.
Geissinger, John; Keller, Frank; Trevino, Scott; Kamel, Toru; "Tape Based CSP Package Supports Fine Pitch Wirebonding," The International Electronics Manufacturing Technology Symposium (IEMT 2002) Proceedings, 2002, pp. 41-45.

\* cited by examiner

*Primary Examiner*—Cuong Nguyen
(74) *Attorney, Agent, or Firm*—Yingsheng Tung; Wade James Brady, III; Frederick J. Telecky, Jr.

(57) ABSTRACT

A method, comprising bonding a first wire to a single die bond pad to form a first bond, bonding the first wire to a bond post to form a second bond, bonding a second wire to the first bond, and coupling the second wire to the bond post.

6 Claims, 12 Drawing Sheets

DOUBLE DENSITY METHOD FOR WIREBOND INTERCONNECT

BACKGROUND

Increasing demand for high-performance integrated circuit ("IC") design may prompt an increase in the number of input/output ("I/O") connections (i.e., bond pads) for a defined die size. An increased number of I/O connections currently may be accommodated with one of at least two commonly-known techniques. In a first technique, multiple rows of I/O connections are staggered in which the bond pads from one row are offset relative to bond pads from another row. Staggered designs generally require an increase in die size, and thus a staggered design presents an undesirable increase in production costs. Furthermore, additional bond fingers may be necessary to accommodate additional power and ground connections to maintain IC functionality, thereby further increasing manufacturing costs.

A second technique of increasing the number of I/O connections comprises reducing bond pad size, thereby allowing a greater number of bond pads to be formed on the die. However, decreased bond pad size necessitates a wirebond wire of reduced diameter (i.e., cross-sectional area of the wire). Decreasing wire diameter presents multiple disadvantages. One disadvantage is an increase in resistance and inductance in the wire and thus a decrease in IC performance quality. Another disadvantage is introduced by a wire "sweeping" (i.e., moving out of place) effect during a common molding process. To counteract wire sweeping, wire length must be reduced, thereby increasing complexity of manufacture. A third disadvantage may arise in dies with a staggered design and reduced bond pad size. Due to a dense bond pad pitch, bond wires may be placed closely together, thereby increasing the risk of crossing multiple wires.

A decrease in wire diameter, which increases wire inductance, may present several additional disadvantages. For example, an increased wire inductance may necessitate an increase in the number of power and ground connections needed for the IC to properly function. In turn, an increase in the number of power and ground connections may limit the amount of die space available for I/O connections. To maintain high performance levels, I/O connections may be dropped to the substrate, thereby reducing available substrate routing area.

BRIEF SUMMARY

The problems noted above are solved in large part by a method that uses multiple wires to connect a die bond pad with a bond post. One exemplary embodiment may comprise bonding a first wire to a single die bond pad to form a first bond, bonding the first wire to a bond post to form a second bond, bonding a second wire to the first bond, and coupling the second wire to the bond post.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections. When used as a noun, the terms "bond" and "wirebond" are intended to indicate an electrical connection of two or more entities. When used as a verb, the term "bond" is intended to indicate the implementation of a bond as defined above. Further, the term "bond post" may be used interchangeably with the term "bond finger" and/or any commonly used, synonymous term. The terms "outer die pad," "bond pad," "die bond pad" and/or "outer die bond pad" also may be used interchangeably.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Presented herein are techniques to create multiple ball bonds atop existing bonds with minimal impact on IC reliability. These techniques increase the number of I/O connections on a die without incurring some or all of the previously mentioned difficulties. In accordance with various preferred embodiments of the invention, by using Stand Off Stitch Wirebond technology ("SSB") (or other appropriate bonding technology) to conjoin multiple bonds and increase the total amount of wire between these bonds, the techniques presented below substantially increase the cross-sectional area of each wire connection relative to the cross-sectional area of a single wire connection. This increase in cross-sectional area of wire reduces connection resistance, improves connection inductance and allows an increase in the number of I/O connections on a fixed-size die without a loss in performance quality.

Figure 1A:
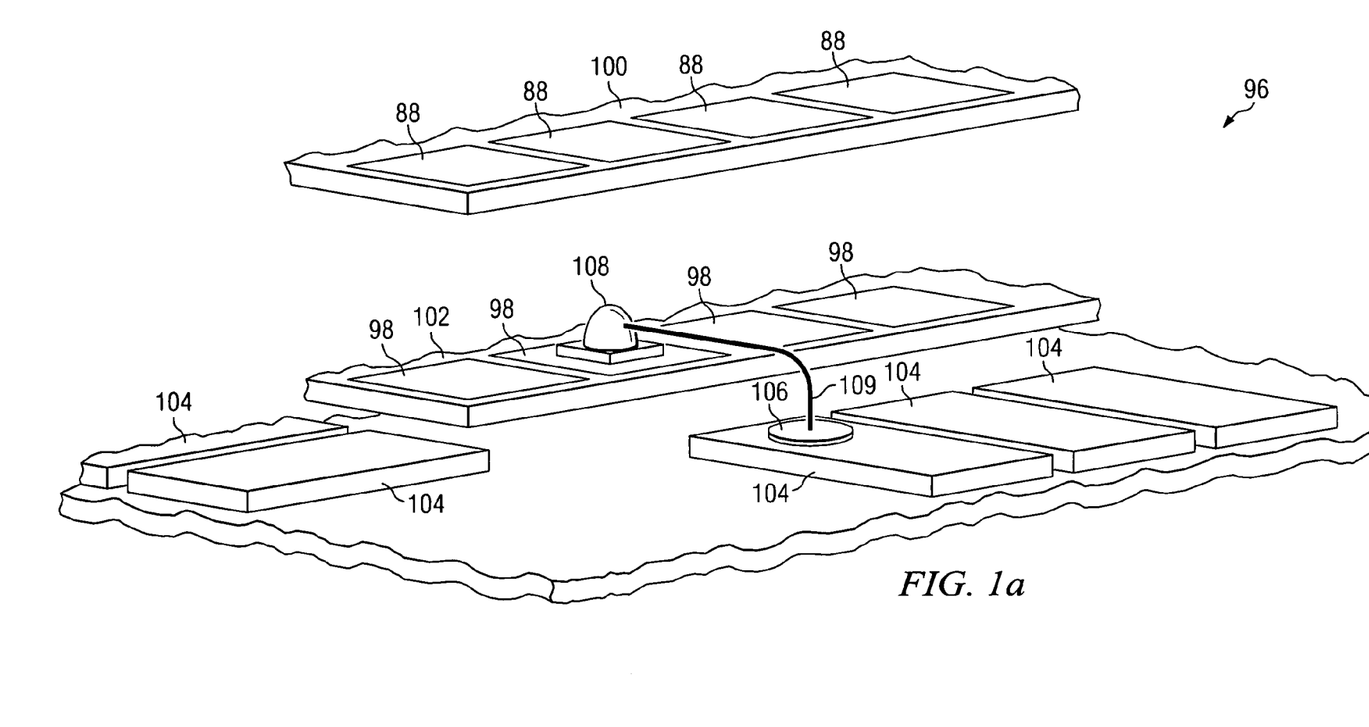
FIGS. 1a–1d show the formation of a wirebond between a die and substrate bond finger in accordance with two embodiments of the invention.
Figure 1B:
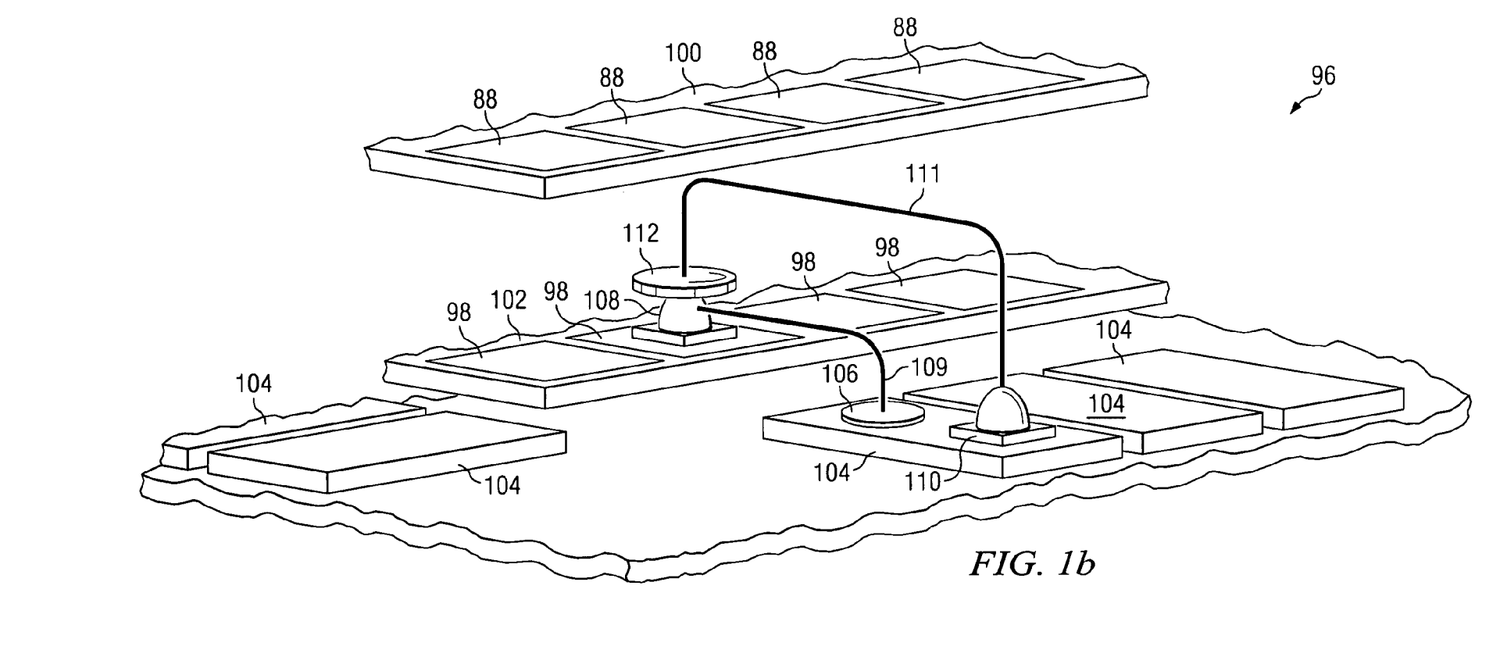
Figure 2A:
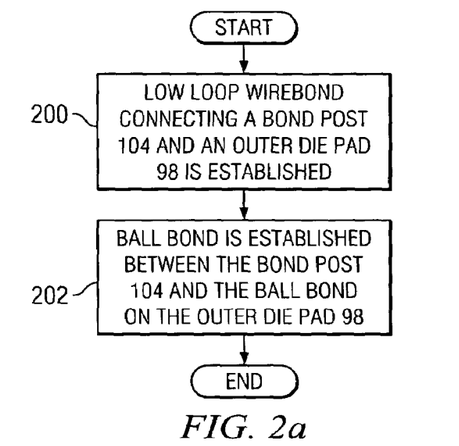
FIGS. 2a–2c illustrate various processes pertaining to the bond pad-to-die connections illustrated in FIGS. 1a–1c.

FIGS. 1a and 1b show one exemplary embodiment and FIG. 2a shows a process associated with this embodiment. FIGS. 1a and 1b show an IC package 96 that comprises a pair of dies 100 and 102. Each die comprises one or more outer die pads 98. The outer die pads 98 and outer die pads 88 are used to provide electrical connectivity between circuitry formed on the die and devices external to the IC package 96. The IC package 96 also comprises a plurality of bond posts 104. Each bond post 104 can be electrically connected to one or more of the outer die pads 98 or one or more of the outer die pads 88. The purpose of the bond posts is to facilitate connections being made between external devices and the dies' outer die pads. In the example of FIG. 1a, a wire 109 within the IC package 96 interconnects one of the die pads 98 to one of the bond posts 104. As such, one end of the wire 109 is bonded to a die pad 98 and the opposite end of the wire 109 is bonded to a bond post 104. In at least some embodiments, the outer die pads 98 may be of a size such that a desired number of outer die pads 98 can be formed on the die 102.

Referring now to FIGS. 1a and 2a, a preferred process begins with the creation of a low loop wirebond (block 200 in FIG. 2a) in which the wire 109 is connected between a bond post 104 and an outer die pad 98. More specifically, a wedge bond 106 is formed on the bond post 104, thereby electrically mating the wire 109 to the bond post 104. Further, a ball bond 108 is formed on the outer die pad 98, thereby electrically mating the other end of the wire 109 to the outer die pad 98. Thus, a current pathway is formed between the outer die pad 98 and the bond post 104. In other embodiments, any type of bond may be used for the wedge bond 106 and/or the ball bond 108. For example, a ball bond may be substituted for a wedge bond as desired. Further, any of a variety of loop profiles (i.e., physical wire arrangements) can be used to implement wires of varying angles and shapes as desired.

After bonding the wire 109 in place as shown in FIG. 1a, a second wire 111 is bonded in place as shown in FIG. 1b and described in block 202 of FIG. 2a. In at least one embodiment, the wire 111 is bonded in place with a SSB technique or some other appropriate bonding technique. More specifically, the process includes forming a ball bond 110 on the bond post 104 and forming a wedge bond 112 on top of the ball bond 108. In the embodiment of FIG. 1b, the wires 109 and 111 are adhered to two separate locations on the bond post 104, while the wires 109 and 111 are adhered to the same location on the outer die pad 98. Further, because two wires are used to connect the pad 98 to the bond post 104, the cross-sectional area of the combined wires 109 and 111 is greater than if only one of the wires were used, effectively reducing the resistance between the pad 98 and the bond post 104. Because of low wire height requirements between dies, the disclosed technique may be useful for stacked die ICs.

Figure 1C:
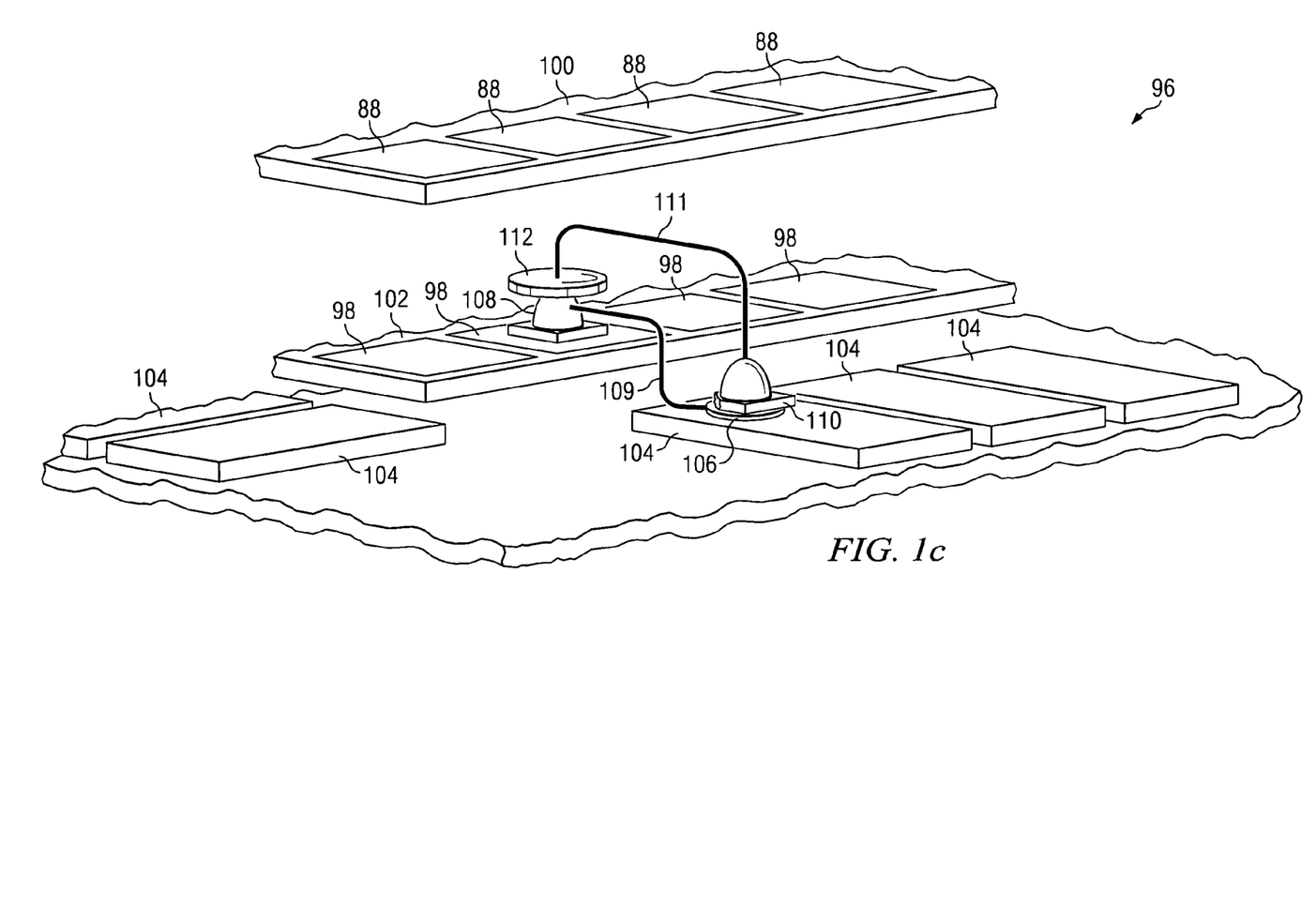
Figure 2B:
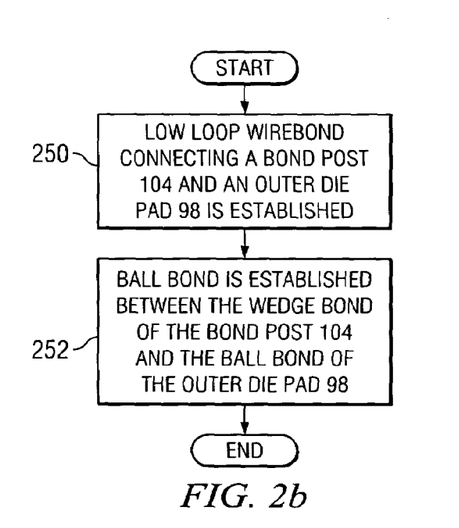

FIG. 1c illustrates an alternative embodiment in which the ends of the wires 109 and 111 that adhere to the bond post 104 are adhered to a common location on the bond post 104 rather than, as in FIG. 1b, two separate locations. The technique depicted in FIG. 1c is also described in FIG. 2b and comprises creating a low loop wirebond (block 250) in which the wire 109 is bonded in place between bond post 104 using a wedge bond 106 and the outer die pad 98 using a ball bond 108 as described above and as shown in FIG. 1a. In block 252, a ball bond or any appropriate type of bond then may be created as illustrated in FIG. 1c in which the wire 111 is bonded in place. More specifically, one end of the wire 111 is adhered to the bond post 104 by way of a ball bond 110 formed on the wedge bond 106. The other end of the wire 111 is adhered to the outer die post 98 by way of a wedge bond 112 formed on top of the ball bond 108.

Figure 1D:
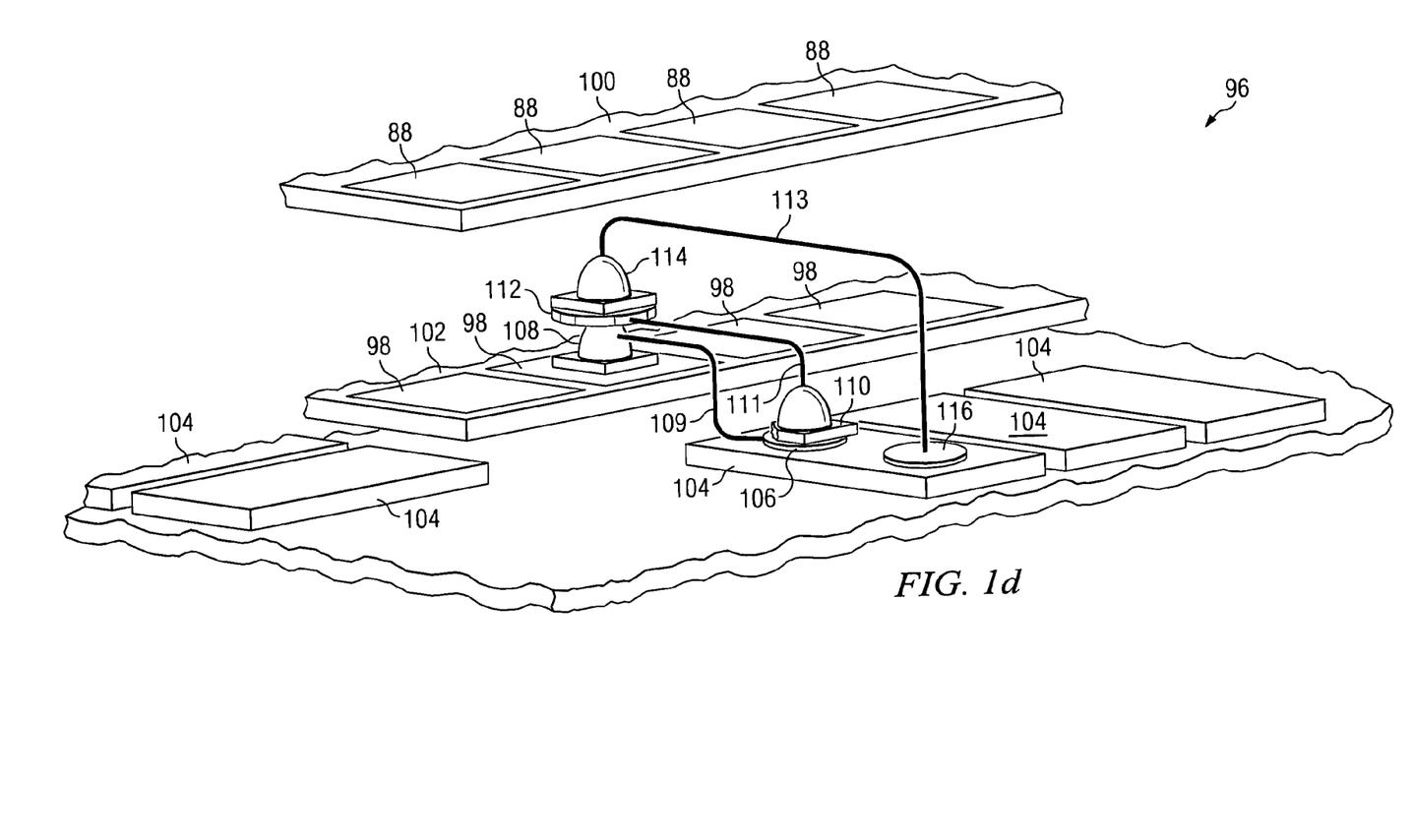
Figure 2C:
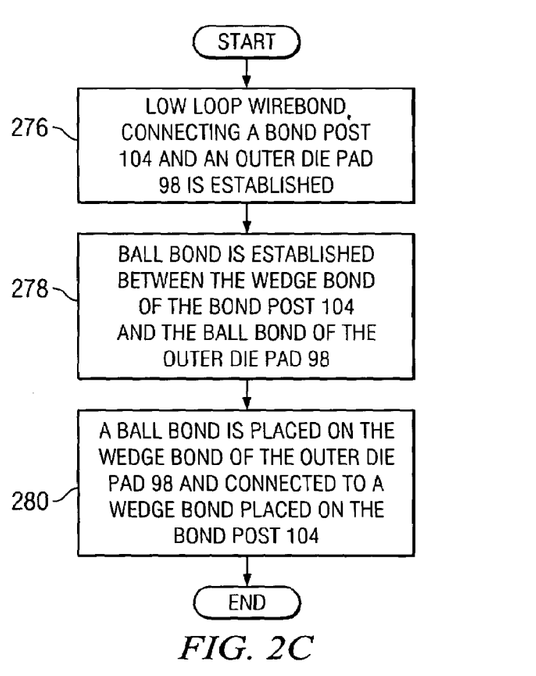

FIG. 1d illustrates yet another alternative embodiment nearly identical to the embodiment presented in FIG. 1c with the exception of an additional wire 113 bonded to the bond post 104 and the wedge bond 112. The technique depicted in FIG. 1d is also illustrated in FIG. 2c and comprises creating a low loop wirebond (block 276) in which the wire 109 is bonded in place between the bond post 104 using a wedge bond 106 and the outer die pad 98 using a ball bond 108 as described above and as shown in FIG. 1a. In block 278, a ball bond 110 or similar bond (e.g., a SSB technique) then may be created as illustrated in FIG. 1c, in which the wire 111 is bonded in place as described above. In block 280, one end of a wire 113 is adhered to the bond post 104 by way of a wedge bond 116. The other end of the wire 113 is adhered to the outer die pad 98 by way of a ball bond 114 formed atop the wedge bond 112, as illustrated in FIG. 1d. In this way, the cross sectional area of wire connecting the outer die pad 98 and the bond post 104 is greater than if only one of the wires was used, substantially reducing wire inductance, improving conductivity and reducing IC design and manufacturing costs. In this way, performance may be improved by bonding any number of wires to the outer die pad 98 and the bond post 104.

Figure 3A:
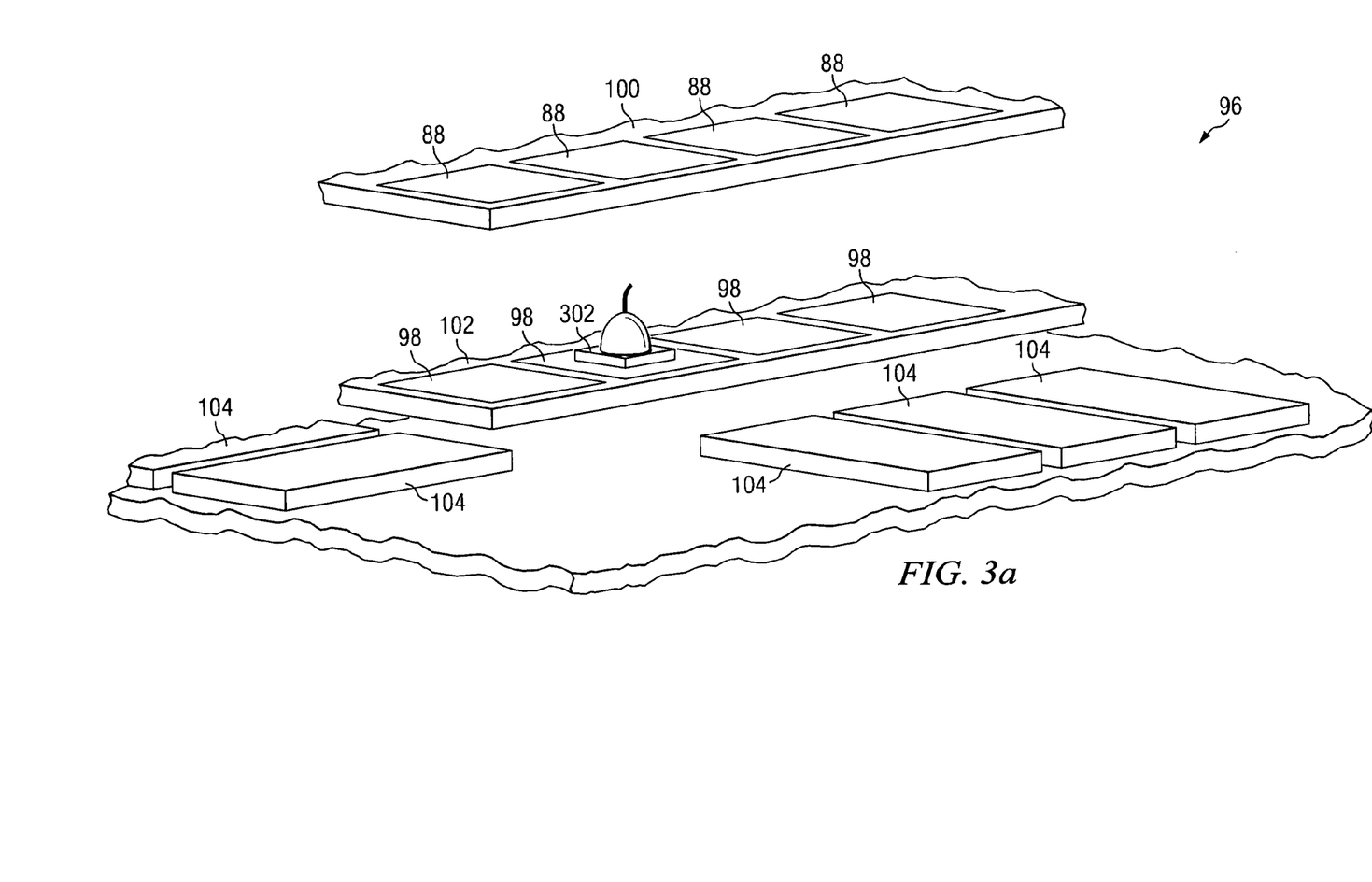
FIGS. 3a–3c illustrate an alternative embodiment of forming connections between a bond pad and a bond post.
Figure 3B:
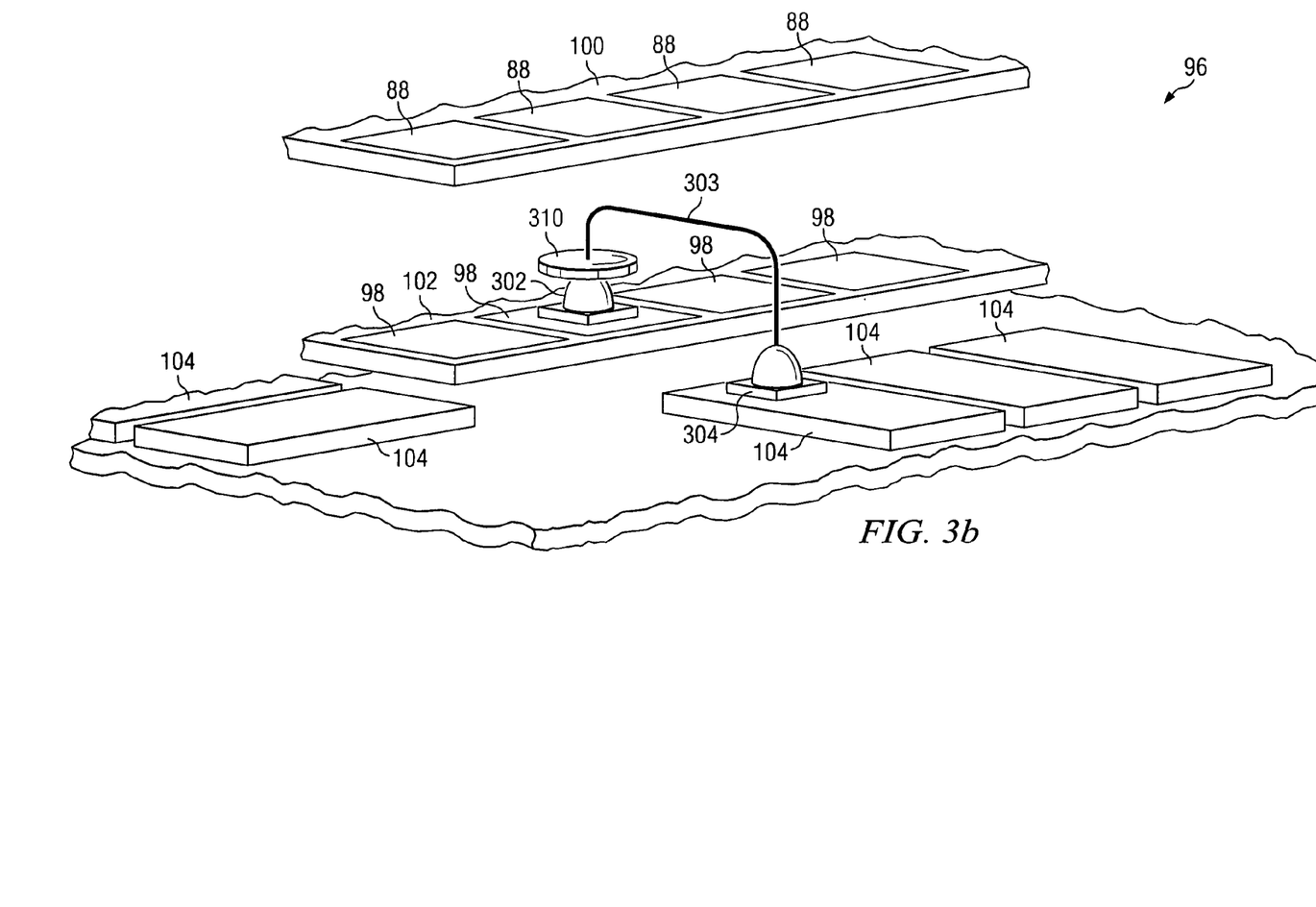
Figure 3C:
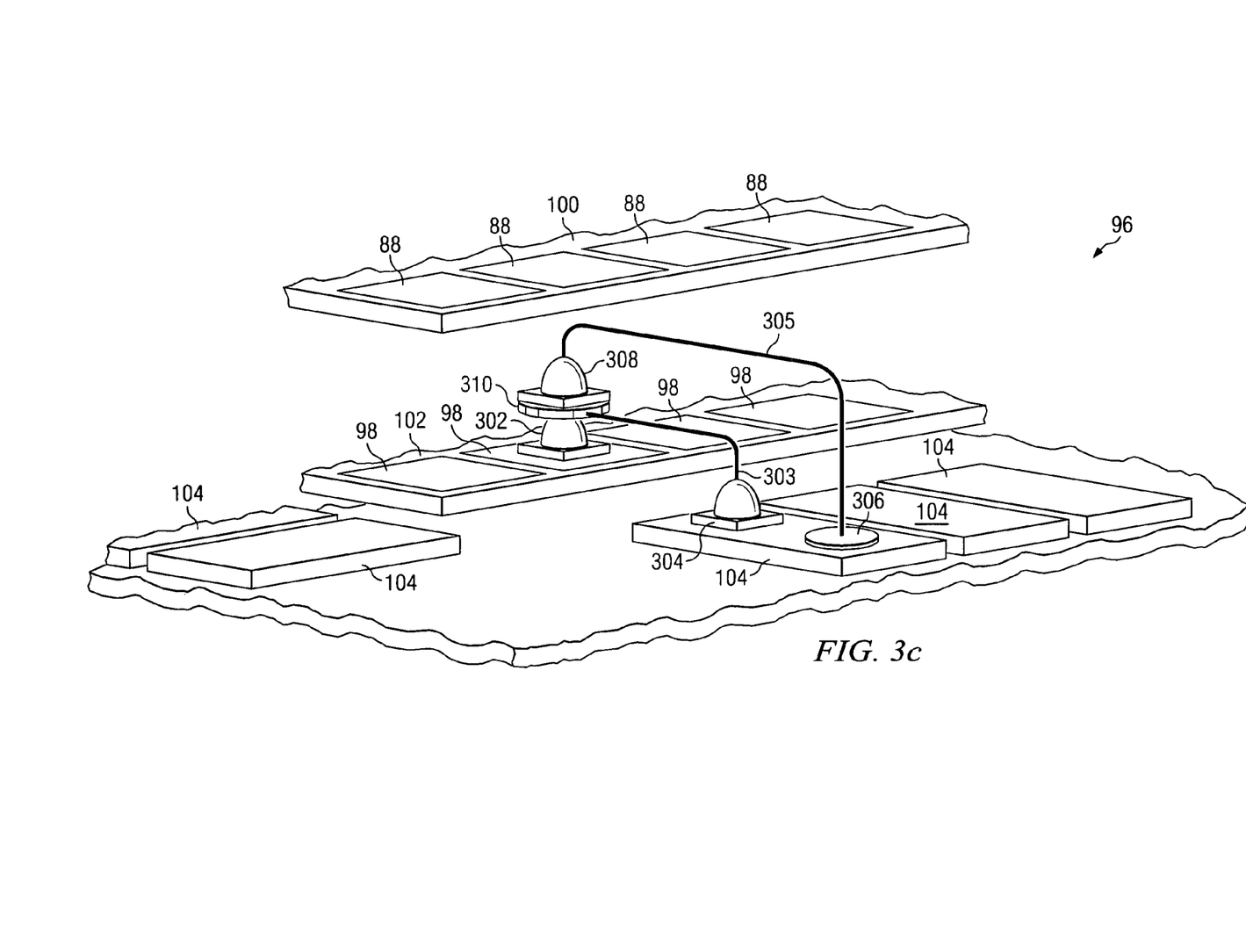
Figure 4:
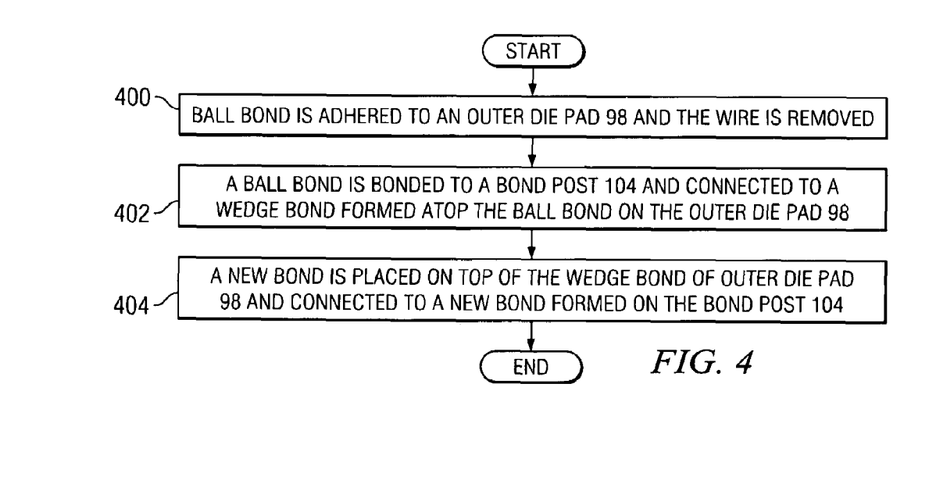
FIG. 4 illustrates a process pertaining to the embodiments of FIGS. 3a–3c.

Another such technique is illustrated in FIGS. 3a–3c, with FIG. 3a being generally duplicative of FIG. 1a for ease of following the discussion below. FIGS. 3a–3c each show an IC 96 comprising a plurality of bond posts 104 and a die 100 stacked atop a die 102 comprising multiple outer die pads 98. The technique depicted in FIGS. 3a–3c is also illustrated in FIG. 4 and comprises establishing a ball bond 302 on the outer die pad 98 and removing the wire attached to the ball bond 302 (block 400). In block 402, a ball bond 304 may be formed on the bond post 104 and connected to a wedge bond 310 formed atop the ball bond 302 by way of a wire 303, as illustrated in FIG. 3b. In block 404, a wire 305 may be adhered to the bond post 104 by way of a wedge bond 306 and to the outer die pad 98 by way of a ball bond 308 formed atop the wedge bond 310. As previously mentioned, the scope of disclosure is not limited to the types of bonds described above. Bond types may be freely interchanged as desired. For example, in another embodiment, block 404 may comprise electrically connecting the bond post 104 and the bond pad 98 by way of a wire 305 bonded to the bond post 104 with a ball bond and bonded to the wedge bond 310 with any type of bond (not shown).

In an example, the outer die pad 98 is of a size such that a maximum of a 0.8 mm diameter wire can be bonded to the outer die pad 98. A wire with a diameter greater than 0.8 mm generally would not be used, because such a wire may touch neighboring wires or outer die pads 98, causing a short circuit and compromising the functional integrity of the IC 96. Because a 1 mm diameter wire is considered to be a standard size wire, the thinner 0.8 mm diameter wire has a greater inductance than the standard size wire. However, implementing any of the techniques described above causes the total cross-sectional area of wires connecting the outer die pad 98 to the bond post 104 to be greater than the cross-sectional area of a single wire connecting the outer die pad 98 to the bond post 104. Thus, the overall inductance of the wires may be equal or superior to the inductance of the 0.8 mm wire or even the 1 mm wire. Similarly, the resistance of the wires may be substantially lower than the resistance of a single wire, thereby allowing a greater amount of current to be transferred between the outer die pad 98 and the bond post 104.

Figure 5A:
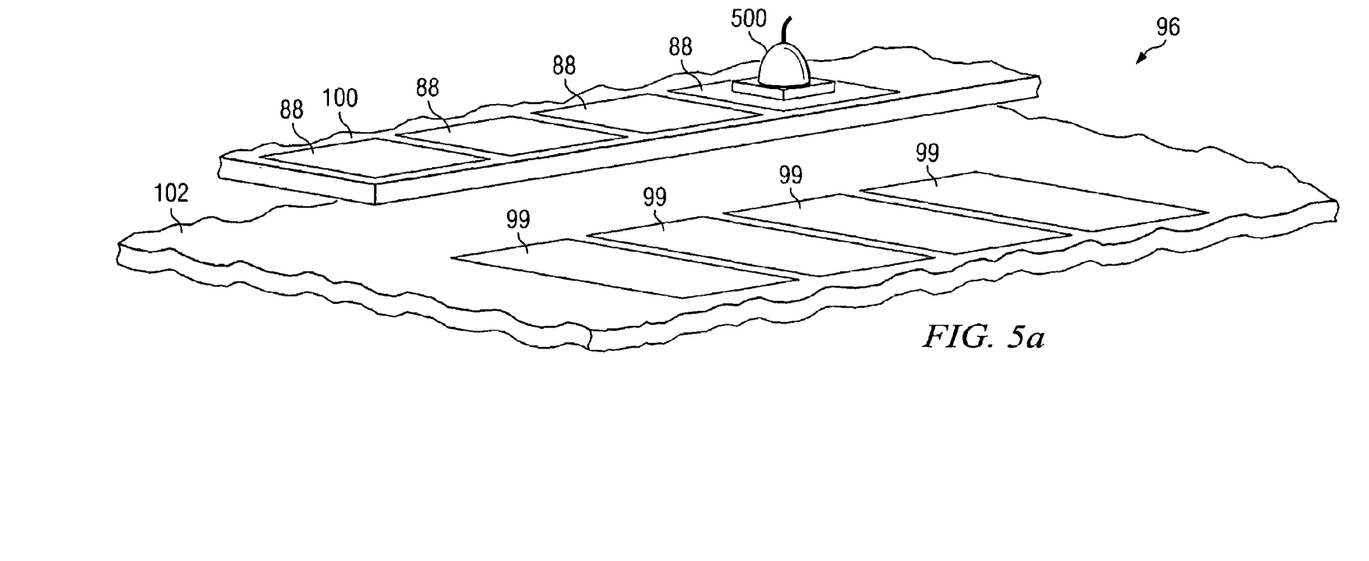
FIGS. 5a–5c show an alternative embodiment of forming wirebond connections on bond pads between multiple dies.
Figure 5B:
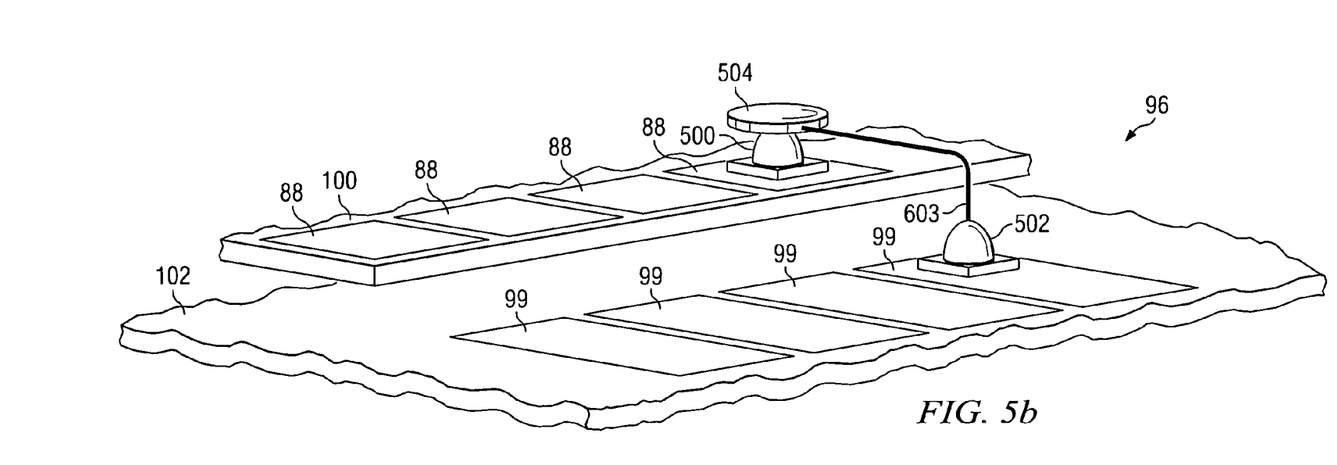
Figure 5C:
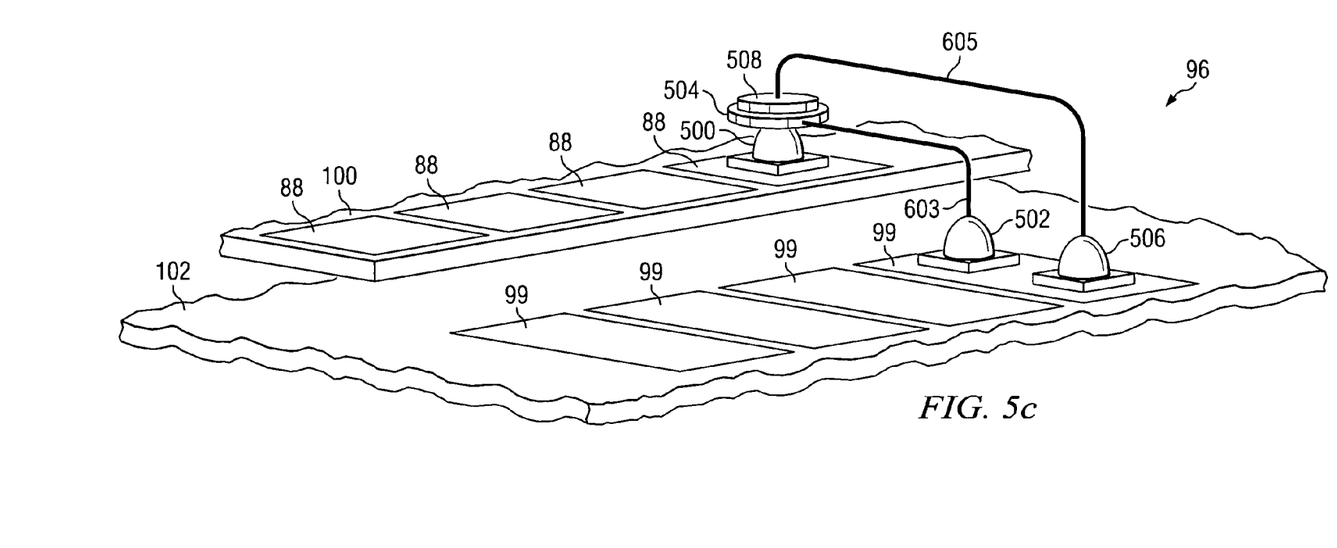
Figure 6:
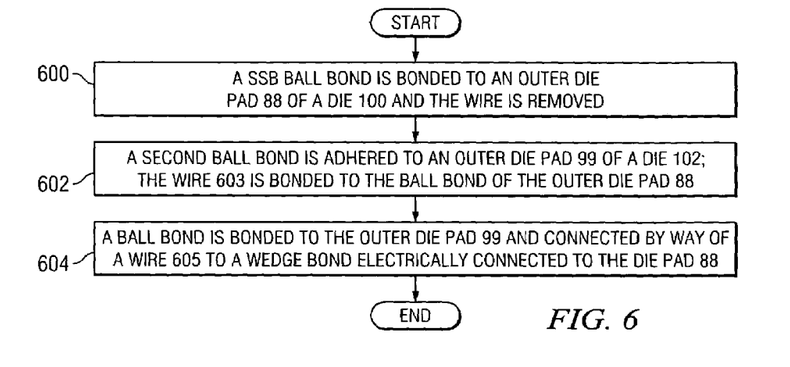
FIG. 6 shows a process that pertains to the embodiment of FIGS. 5a–5c.

The techniques disclosed herein are not limited to bonding die bond pads to bond posts. Such double-bonding techniques also may be applied to wires connecting die bond pads to other die bond pads, as illustrated in FIGS. 5a–5c. FIGS. 5a–5c each show an IC 96 comprising a die 100 stacked atop a die 102. The die 100 comprises a plurality of outer die pads 88 and the die 102 comprises a plurality of elongated outer die pads 99. The technique depicted in FIGS. 5a–5c is also illustrated in FIG. 6 and comprises forming a ball bond 500 on an outer die pad 88 and removing the wire attached to the ball bond 500 (block 600). In block 602, a wire 603 is adhered to the outer die pad 99 by way of a ball bond 502 and to the outer die pad 88 by way of a wedge bond 504 formed on top of the ball bond 500, as shown in FIG. 5b. In block 604, a wire 605 may be adhered to the outer die pad 99 by way of a ball bond 506 formed atop the outer die pad 99 and to the outer die pad 88 by way of a wedge bond 508 formed atop the wedge bond 504, as illustrated in FIG. 5c. In at least some embodiments, any number of wires may be bonded or otherwise electrically connected to the outer die pad 88 and the outer die pad 99. The scope of disclosure is not limited to the types of bonds previously discussed; bond types may be interchanged with any of a variety of bond types as desired.

Figure 7A:
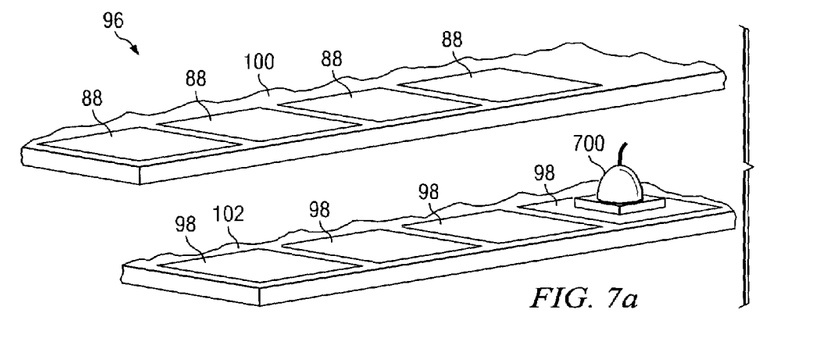
FIGS. 7a–7c show another embodiment of forming wirebond connections on bond pads between multiple dies.
Figure 7B:
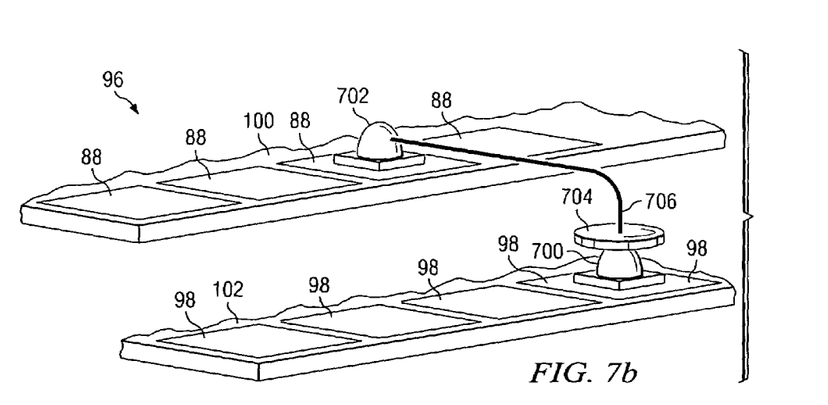
Figure 7C:
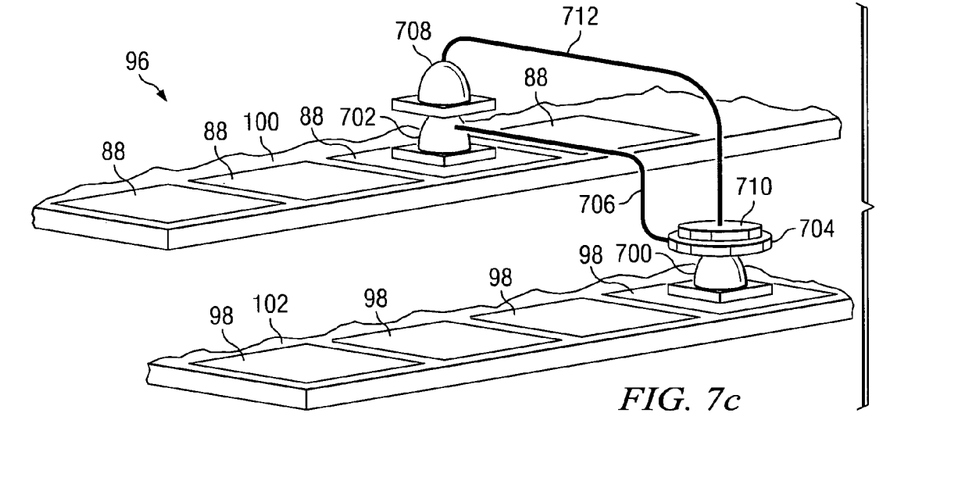
Figure 8:
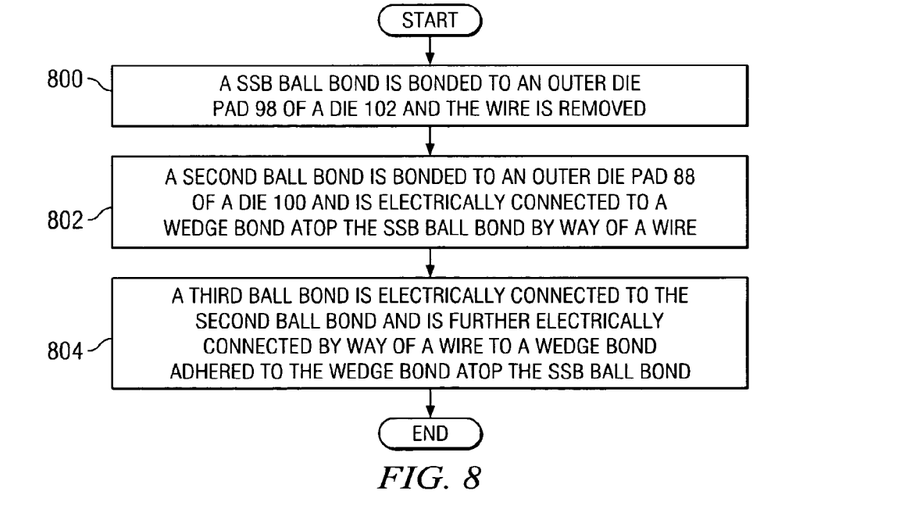
FIG. 8 shows a process that pertains to the embodiment of FIGS. 7a–7c.

Another die-to-die double-bonding technique is illustrated in FIGS. 7a–7c. FIGS. 7a–7c each show an IC 96 comprising a die 100 stacked atop a die 102. The die 100 comprises a plurality of outer die pads 88 and the die 102 comprises a plurality of outer die pads 98. The technique depicted in FIGS. 7a–7c is also illustrated in FIG. 8 and comprises bonding a SSB ball bond 700 or other appropriate bond to an outer die pad 98 of a die 102 and removing the wire, thus leaving only the ball bond 700 on the pad 98 (block 800). A second ball bond 702 then is bonded to an outer die pad 88 of a die 100 and is electrically connected by way of a wire 706 to a wedge bond 704 formed atop the ball bond 700 (block 802). Finally, a ball bond 708 is bonded to the ball bond 702 and is electrically connected by way of a wire 712 to a wedge bond 710 formed atop the wedge bond 704 (block 804).

The subject matter disclosed herein may be applied to a single die or multiple dies. While the above embodiments describe specific types of bonds, any type of bond may be substituted for a particular bond (e.g., a ball bond substituted for a wedge bond). All bonds and double bonds, described above, may be created using any bonding technique, such as SD wirebond loops and any variations thereof (e.g., all low-loop and ultra-low-loop bond techniques comprising SSB bonds, wedge bonds, UL bonds, escargot bonds, FJ loop bonds and folded loop bonds). For example, a wedge bond described above may be replaced with an escargot bond. The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit package, comprising:
  a bond finger, and
  a die bond pad couple to the bond finger using multiple wires, each wire electrically connected to the bond finger and the die bond pad, and wherein a first wire is bonded to the bond finger with a first wedge bond and bonded to the die bond pad with a first ball bond.

2. The package of claim 1, wherein a second wire is bonded to the bond finger with a second ball bond and bonded to the first ball bond with a second wedge bond.

3. The package of claim 1, wherein a second wire is bonded to the first wedge bond with a second ball bond and bonded to the first ball bond with a second wedge bond.

4. The package of claim 3, wherein a third wire is bonded to the bond finger with a third wedge bond and bonded to the second wedge bond with a third ball bond.

5. An integrated circuit package, comprising:
  a bond finger, and a die bond pad couple to the bond finger using multiple wires, each wire electrically connected to the bond finger and the die bond pad, and wherein a first wire is bonded to the bond finger with a ball bond and bonded to an existing bond atop the die bond pad with a first wedge bond.

6. The package of claim 5, wherein a second wire is bonded to the bond finger with a second wedge bond and bonded to the first wedge bond with a ball bond.

* * * * *